(12) United States Patent
Pernel et al.

(10) Patent No.: US 11,735,693 B2
(45) Date of Patent: Aug. 22, 2023

(54) METHOD FOR MANUFACTURING A SUBSTRATE COMPRISING A RELAXED INGAN LAYER

(71) Applicant: COMMISSARIAT À L'ÉNERGIE ATOMIQUE ET AUX ÉNERGIES ALTERNATIVES, Paris (FR)

(72) Inventors: Carole Pernel, Grenoble (FR); Amélie Dussaigne, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 153 days.

(21) Appl. No.: 17/123,298

(22) Filed: Dec. 16, 2020

(65) Prior Publication Data
US 2021/0193873 A1    Jun. 24, 2021

(30) Foreign Application Priority Data

Dec. 19, 2019 (FR) ...................................... 1914960

(51) Int. Cl.
*H01L 33/32* (2010.01)
*H01L 33/00* (2010.01)

(52) U.S. Cl.
CPC ........ *H01L 33/325* (2013.01); *H01L 33/0075* (2013.01); *H01L 33/0093* (2020.05); *H01L 2933/0066* (2013.01)

(58) Field of Classification Search
CPC ............. H01L 21/02002; H01L 21/306; H01L 2933/0066; H01L 33/007; H01L 33/0075; H01L 33/0093; H01L 33/06; H01L 33/12; H01L 33/32; H01L 33/325
See application file for complete search history.

(56) References Cited

U.S. PATENT DOCUMENTS

2017/0237234 A1    8/2017   Han et al.

FOREIGN PATENT DOCUMENTS

WO    WO-2021050731 A1 *   3/2021

OTHER PUBLICATIONS

Search Report for French application No. FR 1914960 dated Aug. 20, 2020.

(Continued)

*Primary Examiner* — Matthew C Landau
*Assistant Examiner* — Dmitriy Yemelyanov
(74) *Attorney, Agent, or Firm* — Pearne & Gordon LLP (57) ABSTRACT

A method for manufacturing a substrate comprising the following steps of: providing a stack comprising an initial substrate, a GaN layer, a doped InGaN layer and an unintentionally doped InGaN layer, transferring the doped InGaN layer and the unintentionally doped InGaN layer to an anodising support, so as to form a second stack, dipping the second stack and the counter-electrode into an electrolyte solution, and applying a voltage or current between the doped InGaN layer and a counter electrode, to porosify the doped InGaN layer, and relaxing the unintentionally doped InGaN layer, transferring the doped InGaN layer and the unintentionally doped InGaN layer to a support of interest, forming an InGaN layer by epitaxy on the unintentionally doped InGaN layer, whereby a relaxed epitaxially grown InGaN layer is obtained.

15 Claims, 3 Drawing Sheets

(56) References Cited

OTHER PUBLICATIONS

Even, A. et al. "Enhanced in incorporation in full InGaN heterostructure grown on relaxed InGaN pseudo-substrate" In: Applied Physics Letters, Jun. 26, 2017, vol. 110, pp. 262103-262103-5.

Jang, Lee-Woon et al. "Electrical and structural properties of GaN films and GaN/InGaN lightemitting diodes grown on porous GaN templates fabricated by combined electrochemical and photoelectrochemical etching" In: Elsevier Journal of Alloys Compounds, 2014, vol. 589, pp. 507-512.

\* cited by examiner

METHOD FOR MANUFACTURING A SUBSTRATE COMPRISING A RELAXED INGAN LAYER

CROSS-REFERENCE TO RELATED APPLICATIONS

This application claims priority from French Patent Application No. 1914960 filed on Dec. 19, 2019. The content of this application is incorporated herein by reference in its entirety.

TECHNICAL FIELD

The present invention is concerned with the general field of colour microdisplays.

The invention relates to a process for manufacturing a substrate or pseudo-substrate comprising a relaxed InGaN layer.

The invention also relates to a substrate or pseudo-substrate comprising a relaxed InGaN layer.

The invention finds applications in many industrial fields, especially in the field of colour micro-displays based on micro-LEDs with a pitch of less than 10 μm.

STATE OF PRIOR ART

Colour microdisplays include red, green and blue pixels (RGB pixels).

The blue and green pixels can be made from nitride materials and the red pixels can be made from phosphor materials. To combine these three types of pixels on the same substrate, the so-called "pick and place" technique is generally used. However, in the case of microdisplays with pixels smaller than 10 μm, this technique can no longer be used due not only to alignment problems, but also to the time required to carry out such a technique on this scale.

Another solution is to perform colour conversion using quantum dot (QD) or nanophosphors. However, controlling the deposition of these materials on small pixels is difficult and their flow resistance is not sufficiently robust.

It is therefore crucial to be able to obtain the three RGB pixels natively with the same family of materials and on the same substrate. For this, InGaN is the most promising material. This material can, indeed, theoretically cover the entire visible spectrum depending on its indium concentration. Blue InGaN-based micro-LEDs already show a high luminance, much higher than their organic counterparts. To emit at green wavelengths, the quantum wells (QWs) of the LED should contain at least 25% indium and for red emission, at least 35% indium is required. Unfortunately, the quality of the InGaN material above 20% In is degraded due to the low miscibility of In in GaN, but also due to the strong compressive stress inherent to the growth of the InGaN active zone on GaN.

It is therefore essential to be able to reduce the overall stress in GaN/InGaN-based structures.

To address this issue, several solutions have been contemplated.

A first solution is to form nanostructures, such as nanowires or pyramids, to be able to relax stresses through the free edges. The growth of axial nanowires can be achieved by molecular beam epitaxy (MBE). In practice, the low growth temperature used in MBE growth leads to low Internal Quantum Efficiencies (IQE). Pyramids are used to bend dislocations. In particular, complete pyramids have semi-polar planes favourable to the In incorporation and to the reduction of the internal electric field of the active zone. For truncated pyramids, the truncated faces allow quantum well growth on the c-plane, which leads to a more homogeneous emission compared to an emission along semi-polar planes of a complete pyramid. Alternatively, growth can also take place in a planar manner on planes other than the c-plane of the wurtzite structure, such as growth on the semi-polar planes which are more favourable to In incorporation.

Another solution is to reduce stresses in the active zone of the LED structure by using a substrate or pseudo-substrate with a lattice parameter closer to the lattice parameter of the InGaN alloy of the quantum wells. Thus, even with a planar configuration, the In incorporation rate in InGaN can be increased. It has been shown that, as the substrate lattice parameter increases, the internal electric field is reduced as compared to a stressed layer of the same In concentration and the quantum well emissions are shifted towards the red. The resulting relaxed InGaN layer allows a III-N heterostructure to be grown by metal-organic vapour phase epitaxy (MOVPE). However, to date, to our knowledge, the only substrate that enabled this demonstration is Soitec's pseudo-substrate InGaNOS. It is manufactured by implementing the Smart Cut™ technique. Relaxation of the InGaN layer is achieved through various heat treatments [1]. However, with such a process, cracks may appear in the InGaN layer and/or the surface of the InGaN layer may lose its flatness.

Another solution to reduce overall stresses in GaN/InGaN-based LED structures is to porosify the GaN layer. In reference [2], a stack is first prepared comprising a sapphire substrate covered with an unintentionally doped GaN layer (uid GaN) and an n+ doped GaN layer. The doped GaN layer acts as the anode. The cathode is a platinum wire. Electrochemical porosification is carried out in an oxalic acid solution (0.2M) by applying a 15V voltage for 30 min and then under ultra-violet radiation in a KOH solution (0.06M) at 9V for 30 min. The porosified GaN layer thus obtained allows a multiple quantum well (MQWs) LED structure composed of an n+ GaN layer, five Gan/InGaN quantum wells (QWs) and a p GaN contact layer as well to be grown. Significant stress relaxation leads to better electrical and optical properties, especially with regard to photoluminescence (PL).

However, the crystal quality of the layers of the LED depends on the pore diameter and porosity of the porosified GaN layer, as well as the desired thickness. It is therefore necessary to find suitable parameters each time, which complicates industrialisation of the process.

DISCLOSURE OF THE INVENTION

A purpose of the present invention is to provide a process for obtaining an at least partially or fully relaxed epitaxially grown InGaN layer, from a GaN/InGaN substrate in order to manufacture, for example, red green blue pixels.

For this, the present invention provides a process for manufacturing a relaxed epitaxially grown InGaN layer from a GaN/InGaN substrate comprising the following steps of:

a) providing a first stack successively comprising an initial substrate, a GaN layer, a doped InGaN layer and an unintentionally doped InGaN layer, b) transferring the doped InGaN layer and the unintentionally doped InGaN layer to an anodising support, the unintentionally doped InGaN layer being in contact with the anodising support, so as to form a second stack, c) connecting the doped InGaN layer and a counter-electrode to a voltage or current generator, d) dipping the second stack and the counter-electrode into an electrolyte solution, e) applying a voltage or current between the doped InGaN layer and the counter-electrode so as to porosify the doped InGaN layer, f) transferring the porosified doped InGaN layer and the unintentionally doped InGaN layer to a support of interest, g) forming an InGaN layer by epitaxy on the unintentionally doped InGaN layer, whereby a relaxed epitaxially grown InGaN layer is obtained.

The invention differs fundamentally from prior art in that a porosification step of the doped InGaN layer is implemented electrochemically.

The porosification structures the surface of the InGaN layer and improves the extraction efficiency and makes it possible to incorporate more In by stress relaxation.

It is easy to adjust the pore dimensions as a function of the doping of the InGaN layer, applied voltage and/or chosen electrolyte (nature and/or concentration) in order to have the necessary relaxation percent to reach the desired wavelength.

The first transfer allows the porosification step to be carried out on the face of the nitrogen (N) polarity InGaN layer, the degree of porosification is thus obtained more easily. The second transfer makes it possible to have a gallium (Ga) polarity on the front side of the substrate, which makes it possible to carry out epitaxial regrowth subsequently.

The undoped or weakly doped InGaN layer is electrically insulating. It is not porosified in step e). It can therefore be used as an epitaxial regrowth layer.

At the end of the process, an InGaNOX ("InGaN on Substrate X")-type structure is obtained with an undoped InGaN layer, without the need for heat treatment, and full plate, i.e. without necessarily having to form mesas.

During the epitaxial regrowth, the growth temperature used (typically 900° C. to 1000° C.) allows the porosified layer to be modified, especially by enlarging pores of this layer, which provides an additional degree of freedom while maintaining the lattice parameter adapted to the epitaxially regrown layer. The epitaxial regrowth layer thus enables the unintentionally doped InGaN layer to be further relaxed. Therefore, this results in an at least partially relaxed, and preferably fully relaxed, InGaN layer.

Advantageously, the anodisation support and/or the support of interest comprises a support layer, for example sapphire or silicon, and a buried oxide layer.

According to a particular embodiment, step b) is advantageously carried out according to a SmartCut™ type process comprising the following steps of:
implanting atomic species to form an embrittlement zone in the doped InGaN layer, at a depth close to the final thickness of the layer to be maintained in the final substrate,
bonding the first stack to the anodising support, with the undoped InGaN layer in contact with the anodising support,
delivering thermal energy to unsecure the doped InGaN layer from the GaN layer at the embrittlement zone.

Advantageously, the first stack further comprises a highly doped GaN layer, provided between the unintentionally doped GaN layer and the doped InGaN layer.

According to this embodiment, step b) can be made according to two advantageous alternatives.

According to the first alternative embodiment, step b) includes the following steps of:
electrochemically anodising the highly doped GaN layer to embrittle it,
separating the doped InGaN layer and the unintentionally doped InGaN layer from the highly doped GaN layer by thermal activation and/or mechanical action.

According to the second advantageous alternative embodiment, step b) includes a step in which the highly doped GaN layer is electrochemically anodised until it dissolves, whereby the doped InGaN layer and the unintentionally doped InGaN layer are separated from the doped GaN layer. The dissolution of the doped GaN layer can be carried out prior to or subsequently to transferring the InGaN layers to the anodising support.

Advantageously, the process includes a subsequent step in which the doped InGaN layer and the unintentionally doped InGaN layer are structured, for example by photolithography, to form InGaN mesas. The formation of the mesas makes it possible to introduce an additional degree of relaxation at the free edges of the mesas.

Advantageously, the process includes a step in which a doping step by implantation or metal-organic vapour phase epitaxy, possibly with different doping types, is performed on the InGaN mesas. For example, an Si (or n-type dopant) implantation can be carried out with different doping types from one mesa to another. This results in pixels, for example three pixels, with different doping levels and therefore different relaxation percents, as well as different emission wavelengths. This alternative embodiment is advantageous for forming a multispectral device, for example LEDs of different colours in a simplified manner or multi-colour micro-display.

According to another advantageous alternative, the process includes, between step b) and step c), a step in which the doped InGaN layer and the unintentionally doped InGaN layer are structured, for example by photolithography, to form InGaN mesas. The mesas are thus formed prior to the porosification step, allowing the mesas to be porosified both through the side faces of the mesas as well as through the upper face in contact with the electrolyte solution.

According to this other advantageous alternative, the process advantageously comprises a step, before step c), during which a doping step by implantation or by metal-organic vapour phase epitaxy, possibly with different doping types, is carried out on the InGaN mesas. For example, it is possible to carry out a selective implantation of an n-dopant (such as silicon) or a p-dopant (such as magnesium) to obtain more or less doped mesas, which will lead to more or less relaxed mesas during the porosification step.

According to a more advantageous alternative, it is possible to carry out the implantation step before the mesas are formed.

Advantageously, the mesas have a thickness of less than 100 nm. Thus, the defect density in the mesas is limited despite the high In concentration.

Advantageously, the undoped or weakly doped InGaN layer has a thickness of less than 3 nm.

Advantageously, the indium rate present in the InGaN layer is greater than or equal to 8%. This ensures an In-rich, quality re-epitaxy.

This process has many advantages:
it is simple to implement,
it can be used for mesas with small thicknesses (typically less than 100 nm),
mesa structuring provides the compliance effect, it leads to a total stress relaxation, which leads to a decrease in piezoelectric polarisation as compared to a stressed layer with the same In concentration, and above all to an increased In incorporation for the same growth conditions, it allows a "bottom up" approach for the manufacture of µLEDs and µdisplays: the growth of optical structures (N, QW, P) is achieved after mesa pixelisation, whatever the pixel size, and enables alignment problems as in the "pick and place" process to be dispensed with, there is no impact of the pixel etching process on the efficiency of the micro-LEDs, which makes it possible to produce micrometric or even sub-micrometric pixels.

With this process, it is possible to reach 40% In in the wells and a quantum efficiency (EQE) higher than 2.9% in red.

The invention also relates to a substrate successively comprising:
a support of interest,
a doped and porous InGaN layer, advantageously having a porosity of more than 1%, and preferably from 5% to 70%,
an unintentionally doped InGaN layer.

The unintentionally doped InGaN layer is not porous.

Advantageously, the support of interest comprises a support layer, for example of sapphire, SiC or silicon, and a buried oxide layer.

The invention also relates to a light-emitting diode structure successively comprising a substrate and an epitaxially regrown stack,
the substrate comprising:
a support of interest,
a doped and porous InGaN layer, advantageously having a porosity of more than 1%, and preferably from 5% to 70%,
an unintentionally doped InGaN layer,
the epitaxially regrown stack successively comprising from the unintentionally doped InGaN layer of the substrate:
a relaxed epitaxially grown InGaN layer doped with a first conductivity type,
an active zone with one or more red, green or blue-emitting InGaN/(Ga,In)N quantum wells in
an InGaN layer doped with a second conductivity type, different from the first conductivity type.

Further features and advantages of the invention will appear from the following additional description.

Needless to say that this additional description is given only by way an illustration of the object of the invention and should in no way be interpreted as a limitation of that object.

BRIEF DESCRIPTION OF THE DRAWINGS

The present invention will be better understood upon reading the description of exemplary embodiments given purely by way of indicating and in no way limiting purposes, with reference to the appended drawings in which.

Different parts represented on the figures are not necessarily drawn to a uniform scale, in order to make the figures more legible.

Different possibilities (alternative and embodiments) are to be understood as being not mutually exclusive and being combinable with each other.

Furthermore, in the description hereafter, terms that depend on the orientation, such as "above", "below", etc., of a structure apply, by considering that the structure is oriented in the way illustrated in the figures.

DETAILED DISCLOSURE OF PARTICULAR EMBODIMENTS

Although this is by no means limiting, the invention finds applications particularly in the field of colour micro-displays, and more particularly in the manufacture of red green blue pixels. However, it could also be used in the field of photovoltaics or water splitting since, on the one hand, InGaN absorbs in the entire visible spectrum and, on the other hand, its valence and conduction bands are around the water stability range, that are thermodynamic conditions necessary for water decomposition. The invention may also be of interest for the manufacture of LEDs or long wavelength emitting lasers.

The process, making it possible to obtain a substrate or pseudo-substrate, comprising an at least partially relaxed unintentionally doped InGaN layer 14, on a doped InGaN layer 13, comprises a step during which the doped InGaN layer 13 is porosified by electrochemical anodisation.

By partially relaxed, it is meant that the lattice parameter a of the unintentionally doped InGaN layer 14 is greater than the lattice parameter a of the GaN on sapphire layer, allowing more In to be incorporated.

The relaxation percent corresponds to:

$$\Delta a/a = (a_{c2} - a_{c1})/a_{c1}$$

with $a_{c1}$, the lattice parameter of the starting layer, and $a_{c2}$ the lattice parameter of the relaxed layer.

The layer is 100% relaxed if $a_{c2}$ corresponds to the lattice parameter of the solid material.

When $a_{c1} = a_{c2}$ the layer is said to be stressed.

By partially relaxed, it is meant a relaxation percent of more than 50%.

More particularly, the process comprise the following steps of:

a) providing a first stack 10 successively comprising an initial substrate 11, a GaN layer 12, a doped InGaN layer 13 and an unintentionally doped InGaN layer 14, b) transferring the doped InGaN layer 13 and the unintentionally doped InGaN layer 14 to an anodising support 21, the unintentionally doped InGaN layer 14 being in contact with the anodising support 21 so as to form a second stack 20, c) connecting the doped InGaN layer 13 and a counter-electrode to a voltage or current generator, d) dipping the second stack 20 and the counter-electrode into an electrolyte solution, e) applying a voltage or current between the doped InGaN 13 layer and the counter-electrode so as to porosify the doped InGaN layer 13, f) transferring the doped InGaN layer 13 porosified and the unintentionally doped InGaN layer 14 to a support of interest 31, g) forming an InGaN layer by epitaxy on the unintentionally doped InGaN layer, whereby a relaxed epitaxially grown InGaN layer is obtained, (h) optionally, forming mesas of micrometre size (for example from 1 μm to several tens of micrometres, preferably with a 5 to 10 μm side) to increase the relaxation percent, by relaxing through the free edges of the mesas.

Step h) can be carried out between step b) and step c) or after step g).

FIGS. 1A to 1D are first referred to.

Figure 1A:
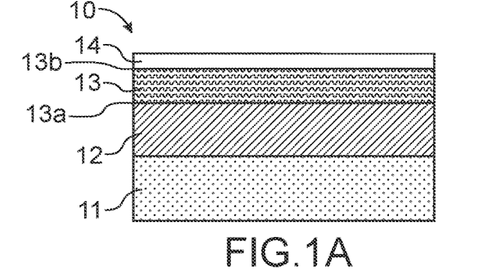
FIGS. 1A, 1B, 1C and 1D schematically represent, in a cross-section view, different steps of a process for manufacturing a substrate, comprising an at least partially relaxed InGaN layer, according to a particular embodiment of the invention.

The first stack 10 provided in step a) and represented in FIG. 1A, comprises an initial substrate 11, for example of sapphire, SiC, silicon or glass. Substrate 11 has, for example, a thickness ranging from 350 μm to 1.5 mm.

The GaN layer 12 has, for example, a thickness ranging from 30 nm to 4 μm. The GaN layer is unintentionally doped. By unintentionally doped GaN, it is meant a doping concentration of less than $5 \cdot 10^{17}/cm^3$.

The doped InGaN layer 13 is n-doped. It has, for example, a thickness ranging from 10 to 200 nm. By doped InGaN, it is meant an electron concentration between $2 \cdot 10^{18}$ and $2 \cdot 10^{19}/cm^3$. The doped InGaN layer 101 is electrically conductive. It is porosified in step e).

The doped InGaN layer 13 has two main faces: a first main face 13a and a second main face 13b. The first main face 13a has nitrogen (N) polarity. It is disposed facing the GaN layer 12. The second main face 13b has Gallium (Ga) polarity. It is disposed in contact with the unintentionally doped InGaN layer 14.

The unintentionally doped InGaN layer 14 has preferably a thickness of less than 3 nm, for example 1 nm. By unintentionally doped InGaN, it is meant a doping concentration of less than $5 \cdot 10^{17}/cm^3$. This layer is electrically insulating. It is not porosified in step e). At the end of step e), the unintentionally doped InGaN layer 14 is non-porous (namely has a porosity of less than 0.01%, preferably less than 0.001%).

Preferably, the first stack 10 consists of the previously mentioned layers. In other words, it does not include any other layers.

These layers are, advantageously, deposited in a full-plate manner on the initial substrate 11.

Figure 1B:
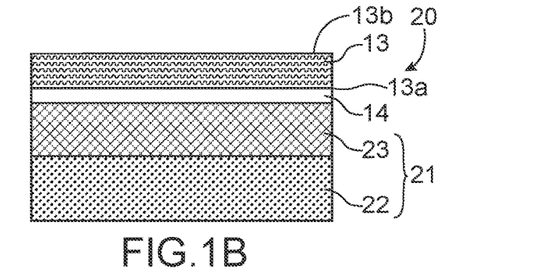
Figure 1C:
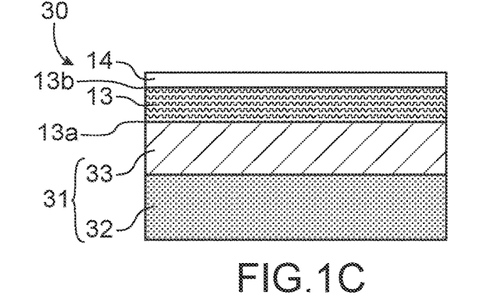

In step b), the doped InGaN layer 13 and the unintentionally doped InGaN layer 14 are transferred to an anodisation support 21 (FIG. 1B).

The free face of the unintentionally doped InGaN layer 14 is preferably transferred to the oxide layer 23 BOX of the anodising support 21, for example by direct or molecular bonding.

The anodising substrate 21 advantageously comprises a support layer 22 and a so-called BOX ("Buried Oxide layer") 23, also sometimes referred to as a continuous oxide layer.

The support layer (or support) 22 is, for example, of sapphire, silicon or glass. The support layer 22 has, for example, a thickness ranging from 350 μm to 1.5 mm.

The oxide layer 23 BOX has, for example, a thickness ranging from 100 nm to 4 μm.

According to an advantageous embodiment, this transfer is made using the Smart Cut™ technique. The process includes the following steps of:

implanting atomic species to form an embrittlement zone in the doped InGaN layer at a depth close to the final thickness of the layer to be maintained in the final substrate;

bonding the first stack 10 to the anodisation support 21, delivering thermal energy to unsecure the doped InGaN layer in the embrittlement zone.

The initial substrate 11 and the unintentionally doped GaN layer 12 of the first stack 10 are detached from the doped InGaN layer 13 by fracturing along the plane of the embrittlement zone. Fracturing is carried out, for example, by heat treatment in a temperature range from 400° C. to 600° C. and for a period of time ranging from a few minutes to a few hours. This fracturing leads to the transfer of the doped InGaN layer 13 and the unintentionally doped InGaN layer 14 to the anodising support 21.

According to a particular embodiment, the initial substrate 11 and the unintentionally doped GaN layer 12 can be detached from the doped InGaN layer 13 by a process of etching a sacrificial intermediate layer, for example with a laser (also known as the "lift off" technique).

At the end of step b), a second stack 20 is thus obtained, successively comprising the support layer 22, the buried oxide layer 23, the unintentionally doped InGaN layer 14, as well as the doped InGaN layer 13 (FIG. 1B). The first face 13a of N polarity is thus accessible.

After implantation of the Smart Cut™, and before the anodisation step, it is possible to perform an Si implantation step to make the doped InGaN layer 13 even more electrically conductive.

According to an alternative embodiment of the process, represented in FIGS. 2A to 2E, the first stack 10 can furthermore comprise a highly doped GaN layer 15, denoted as n++ GaN, between the GaN layer 12 and the doped InGaN layer 13.

Figure 2A:
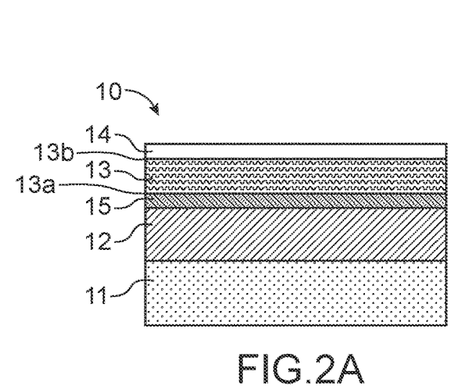
FIGS. 2A, 2B, 2C, 2D and 2E schematically represent, in a cross-section view, different steps of a process for manufacturing a substrate comprising an at least partially relaxed InGaN layer according to a particular embodiment of the invention.
Figure 2B:
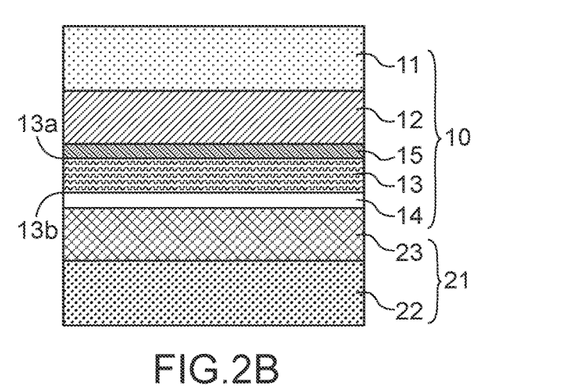

The highly doped GaN layer 15 has, for example, a thickness ranging from 10 to 200 nm. By highly doped GaN, it is meant a doping of $10^{19}/cm^3$ or more.

Figure 2C:
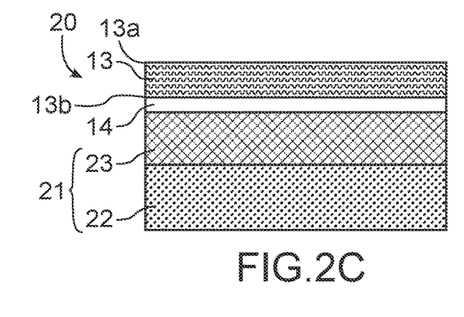
Figure 2D:
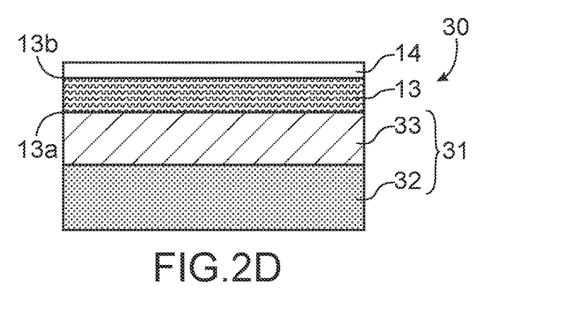
Figure 3:
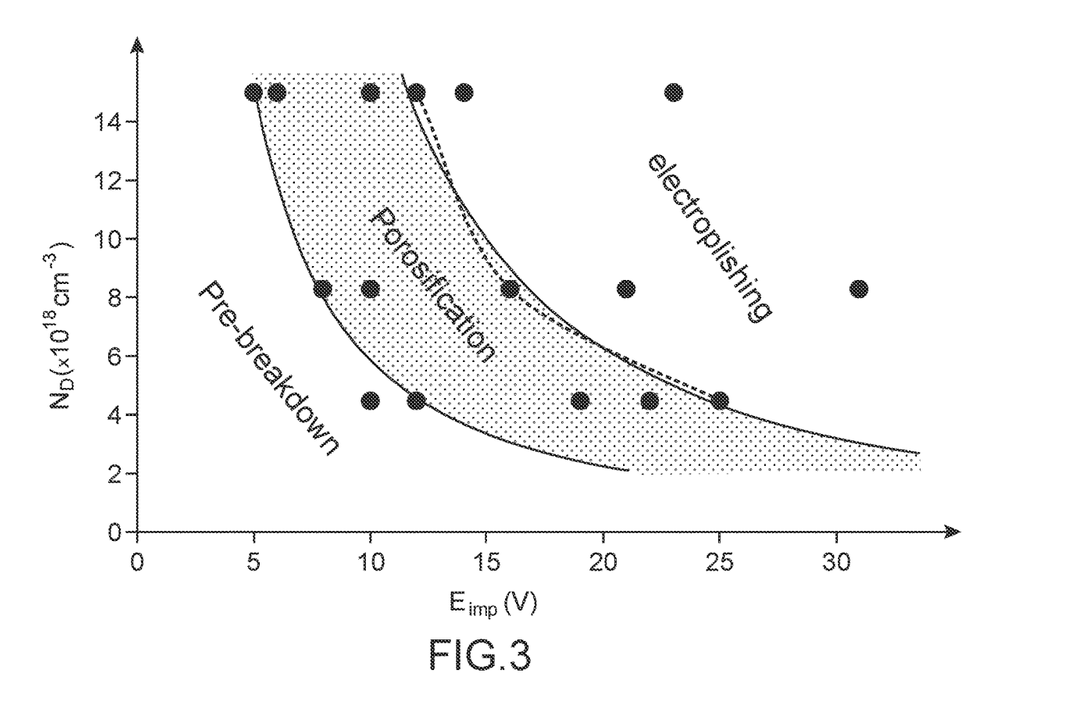
FIG. 3 is a graph representing different phenomena occurring (pre-breakdown, porosification and electropolishing) during an anodisation step, as a function of the doping rate and the potential applied, according to a particular embodiment of the invention.

Advantageously, according to this alternative embodiment, after transfer of the first stack 10 to the anodisation support 21 in step b) (FIG. 2B), the highly doped GaN layer 15 is separated from the doped InGaN layer 14 by electrochemically anodising the highly doped GaN layer 15 so as to porosify it (FIG. 2C). The highly doped GaN layer 15 is used as a membrane. The difference in the doping rate results in a high selectivity between porosification and electropolishing (FIG. 3).

Advantageously, separation is facilitated with thermal and/or mechanical activation.

Alternatively, the anodisation step on the doped 15 GaN layer can be carried out prior to the transfer step b), for example if mechanical stress is required to be applied to unsecure the layer.

When the porosification step on the doped GaN layer 15 is carried out before step b), the porosification rate is controlled to keep consistency of the entire stack. After transfer, a thermal and/or mechanical stress is applied to separate the device into two parts, advantageously at the most brittle interface, i.e. between the highly doped GaN layer and the doped InGaN layer.

The step of porosifying the highly doped GaN layer 15 can be performed using the same electrolyte bath (nature and/or concentration) and/or the same voltage (or current applied) as in the step of porosifying the doped InGaN layer 13 (step e).

Figure 4A:
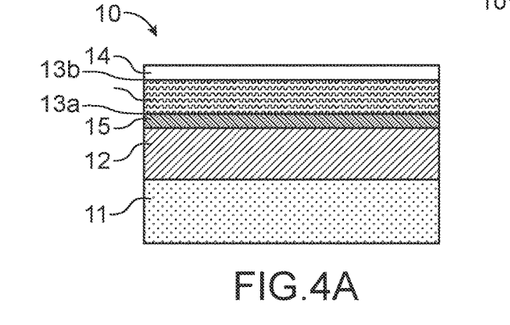
FIGS. 4A, 4B, 4C, 4D and 4E represent schematically, in a cross-section view, different steps of a process for manufacturing a substrate, comprising an at least partially relaxed InGaN layer, according to a particular embodiment of the invention.
Figure 4B:
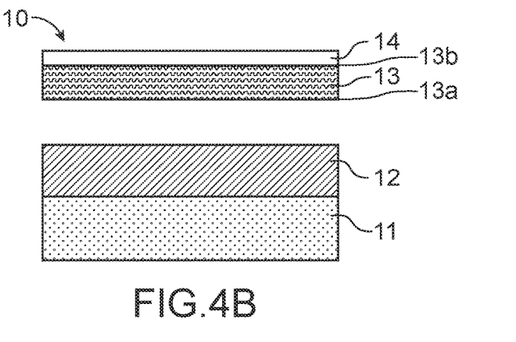

According to an alternative embodiment represented in FIGS. 4A to 4E, the first stack comprises a highly doped GaN layer 15, disposed between the GaN layer 12 and the doped InGaN layer (FIG. 4A). Step b) is carried out according to the following steps of:
- connecting the doped GaN layer 15 and a counter-electrode to a voltage or current generator,
- dipping the first stack 10 and the counter-electrode into an electrolyte solution,
- applying a voltage or current, between the highly doped GaN layer 15 and the counter-electrode so as to etch the highly doped GaN layer 15, whereby the unintentionally doped InGaN layer 14 and the doped InGaN layer 13 are unsecured from the GaN layer 12 (FIG. 4B).

This results in an InGaN membrane.

Figure 4C:
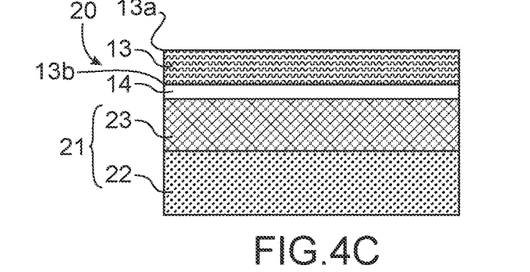
Figure 4D:
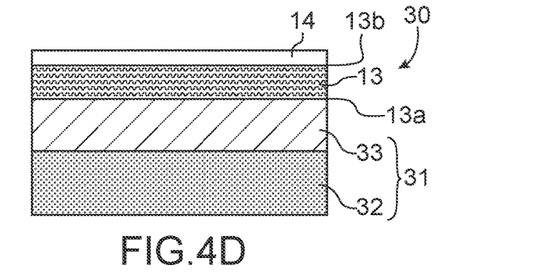

The doped InGaN layer 13 and unintentionally doped InGaN layer 14 are then transferred to the anodisation support 21 (step b—FIG. 4C).

In this embodiment, the n++ GaN layer 15 is laterally etched. Advantageously, this embodiment of the process does not implement an additional step to unsecure the InGaN layers 13, 14 from the other layers of the first stack 10. This alternative embodiment is advantageously used for small-size samples (typically up to a few cm²). For larger areas, electrolyte pathways can be formed beforehand within the doped GaN layer 15.

Following the transfer of the doped InGaN layer 13 and the undoped InGaN layer 14, electrochemical anodisation is carried out on the doped InGaN layer 13. The anodisation can enable the doped InGaN layer 13 to be partially relaxed.

For this, in step c), the second stack 20 and a counter-electrode (CE) 500 are electrically connected to a voltage or current generator. The second stack 20 acts as the working electrode (WE). It will later be referred to as a voltage generator, but it could be a current generator for applying a current between the device and the counter-electrode.

The counter-electrode 500 is made of an electrically conductive material, such as for example a metal like platinum.

In step d), the electrodes are dipped into an electrolyte, also known as an electrolyte bath or electrolyte solution. The electrolyte can be acidic or basic. The electrolyte is, for example, oxalic acid. It can also be KOH, HF, $HNO_3$ or $H_2SO_4$.

It is possible to carry out step d) before step c).

In step e), a voltage is applied between the device and the counter-electrode 500. The voltage can range from 1V to 100V, preferably from 3V to 100V. It is applied, for example, for a period of time ranging from a few seconds to a few hours. The anodisation reaction is finished when, at an imposed potential, the current becomes zero: in this case there is no more charge transfer and the electrochemical reaction stops.

The electrochemical anodising step can be carried out under ultraviolet (UV) light. The process can also include a first electrochemical anodisation without adding ultra-violet radiation and a second electrochemical anodisation by adding ultra-violet radiation.

Advantageously, porosification takes place throughout the volume of the doped InGaN layer 13.

At the end of the porosification step, the porosity rate of the doped InGaN layer 13 is at least 1%. It preferably ranges from 5% to 70%.

The largest dimension (the height) of the pores can vary from a few nanometres to a few micrometres. The smallest dimension (the diameter) can vary from a few nanometres to a few hundred nanometres, in particular from 10 nm to 70 nm, for example from 30 nm to 70 nm, and preferably from 15 nm to 40 nm.

The porosification obtained (porosity rate and pore size) depends on the doping of the doped InGaN layer 13 and the process parameters (applied voltage, period of time, nature and concentration of the electrolyte). By varying the porosification, the rate of incorporation/segregation can be controlled. The porosification, and in particular the pore size, can be varied subsequently during the epitaxial regrowth depending on the applied temperature.

The porosification step allows to have a fully or partially relaxed unintentionally doped InGaN layer 14, on an InGaN layer 13 which after porosification is less doped or even no longer doped at all.

To have the second side 13b of metal (Gallium) polarity on the front face, the second stack 20 is transferred onto a support of interest 31, comprising, for example, a support layer 32 preferably of Si, SiC, glass or sapphire, and an oxide layer BOX 33 (step f).

Step f) can be carried out using the SmartCut™ technique, according to the following steps of:
- implanting atomic species to form an embrittlement zone in the unintentionally doped InGaN layer, at a depth close to the final thickness of the layer to be maintained in the final substrate;
- bonding the unintentionally doped InGaN layer to the support of interest 31,
- delivering thermal energy to unsecure the unintentionally doped InGaN layer at the embrittlement zone.

At the end of the process, a substrate 30 of the InGaNOX ("InGaN on substrate X") type is thus obtained, comprising (FIGS. 1C, 2D, 4D) from the rear face to the front face:
- a support of interest 31, for example, formed by a support layer 32, preferably of sapphire, and an oxide layer BOX 33,
- a porosified doped InGaN layer 13, with Ga polarity on the front face,
- a non-porous at least partially or fully relaxed unintentionally doped InGaN layer 14.

Figure 1D:
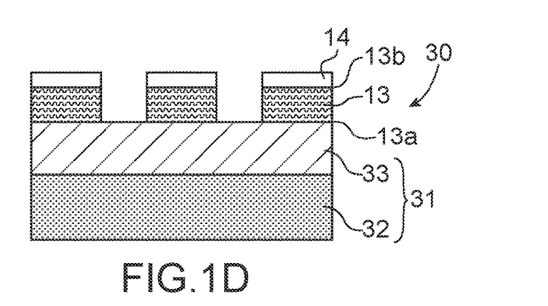
Figure 2E:
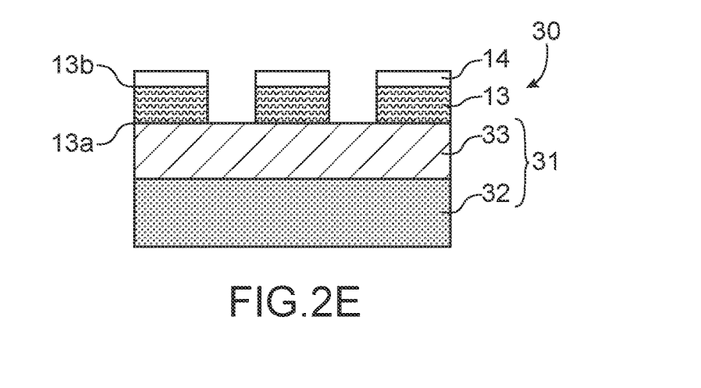
Figure 4E:
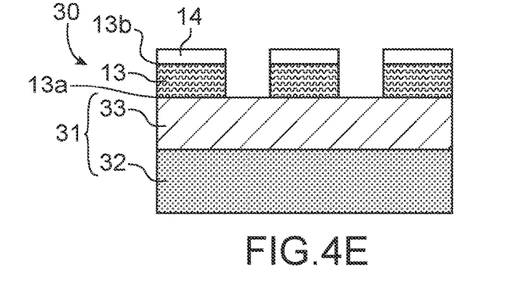

According to an alternative embodiment, the process can include a subsequent step (step h)) in which the porosified InGaN layer and the unintentionally doped InGaN layer are structured to form InGaN mesas (FIG. 1D, 2E, 4E).

According to an advantageous alternative embodiment, the mesas can be formed prior to the porosification step.

The mesas can be structured and then doped. In this alternative embodiment, the process can include, prior to the porosification step, the following steps of:
- structuring the InGaN layer and the unintentionally doped InGaN layer, which are deposited in a full-plate manner, to form InGaN mesas,
- advantageously, filling the space between the mesas with an adapted material and planarise the whole thus obtained to have a planar surface,
- locally implanting a dopant in the mesas at the same or different concentrations; for example, it is possible to perform several implantation operations with different sets of masks.

Alternatively, doping can be performed prior to structuring the mesas. According to this alternative embodiment, the process can include, prior to the porosification step, the following steps of:

locally implanting a dopant in the full-plate deposited doped InGaN layer, wherein the dopant concentration can vary along the InGaN layer so as to form more or less doped zones, structuring the InGaN layer and the unintentionally doped InGaN layer, which are full-plate deposited, to form InGaN mesas.

By way of illustration, it is, for example, possible to use a hard mask, such as a SiN or $SiO_2$ type mask, to carry out the implantation and alignment marks (for example Al, Ti, TiN) to match the mesas to the implanted zones. With two different masks, two zones with different implantation energies can be made, and thus two different doping types in addition to the initial doping of the doped plate, for example by MOCVD. Alignment marks are used to align the two masks for implantation and the mask for mesa etching.

The same set of masks will be used for implantation and mesas.

Structuring the mesas can be done by photolithography.

The mesas, also called elevations, are relief elements. They are obtained, for example, by etching a continuous layer or several superimposed continuous layers, so as to leave only a number of "reliefs" of this layer or these layers. Etching is generally plasma or dry etching (for example RIE plasma). The reliefs make it possible to define pixels.

Preferably, flanks of the mesas are perpendicular to the stack of the different layers of the substrate 30.

The dimensions (width and length) of the mesas range from 500 nm to 500 µm. By width and length, it is meant dimensions parallel to the surface of the underlying stack.

The pitch between two consecutive mesas 100 is from 50 nm to 20 µm.

InGaN mesas comprise a doped InGaN layer 13 and an unintentionally doped InGaN layer 14. Preferably, the mesas consist of these two layers 13, 14.

The doped InGaN layer 13 of the mesas has advantageously a thickness ranging from 10 nm to 200 nm. A layer of a small thickness (less than 100 nm) can contain a high In concentration while maintaining good material quality (few defects). By thickness, it is meant the dimension of the mesa perpendicular to the underlying stack.

Alternatively, doping by implantation can be replaced by doping by metal-organic vapour phase deposition (MOCVD) epitaxy, with Si or Ge doping especially. It is, for example, possible to carry out three successive epitaxy steps to obtain three different doping levels at the end of the process in order to form red, green and blue mesas (RGB).

The process includes a subsequent step in which an epitaxially regrown stack 40 is made either on the full-plate unintentionally doped InGaN layer 14 (FIG. 5) or on the unintentionally doped InGAN layer 14 of the InGaN mesas. This step is advantageously performed to form epitaxially regrown LEDs, in particular all InGaN red (or green) LEDs.

Figure 5:
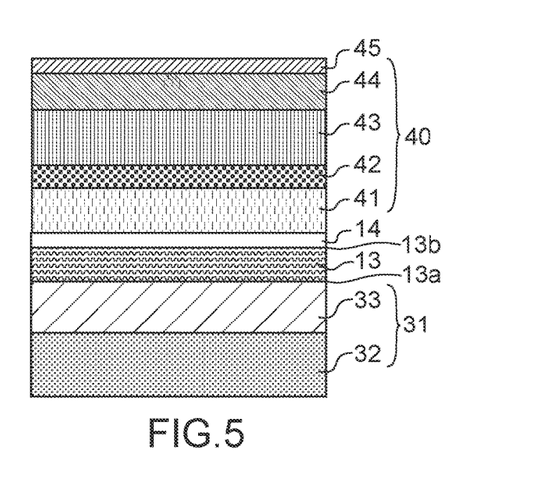
FIG. 5 schematically represents, in a cross-section view, a micro-LED according to a particular embodiment of the invention.

The unintentionally doped InGaN layer 14 is a continuous non-porous 2D layer since it is not porosified during the electrochemical anodisation step. The epitaxially regrown stack 40 is thus facilitated and the epitaxial layer has a better resistance.

The epitaxially regrown stack 40 of an all InGaN LED comprises, for example, successively from the unintentionally doped InGaN layer 14:

a n doped InGaN layer 41, preferably with the same In concentration as the InGaN layer of the relaxed substrate, an active zone 42 with one or more red (or green) emitting InGaN/(Ga,In)N quantum wells, a electron barrier 43 based on p doped AlGaN or GaN, a p doped InGaN layer 44, preferably with the same In concentration as the n-InGaN layer or lower, a p++45 doped InGaN layer, preferably with the same In concentration as the p-InGaN layer.

More particularly, an all-InGaN LED structure can successively comprise:

an InGaN substrate, a 350 nm n-doped InGaN layer, formed by 15×$In_{0.03}Ga_{0.97}N$/GaN (thicknesses 20 nm/1.8 nm), multiple quantum wells (MQWs), formed by 5×$In_{0.40}Ga_{0.60}N$/$In_{0.03}Ga_{0.097}N$ (thicknesses 2.3 nm/5, 7, 11 nm), a uid $In_{0.03}Ga_{0.97}N$ layer (10 nm), an $Al_{0.1}Ga_{0.9}N$:Mg layer (20 nm), a Mg-doped $In_{0.03}Ga_{0.97}N$ layer (125 nm), a p++ doped $In_{0.03}Ga_{0.97}N$ layer (25 nm).

Different growth processes can be used to form epitaxially grown layers.

According to a first alternative embodiment, the regrowth is lateral and a subsequent pixelisation step by etching is advantageously carried out.

According to an alternative embodiment, the regrowth is made vertically above the mesas. In this alternative, the pixels correspond to the underlying mesas.

Advantageously, a passivation layer will be deposited on the flanks of the mesas 100 and/or epitaxially regrown LEDs, for example by atomic layer deposition (ALD). The passivation layer can be of alumina. The passivation layer can have a thickness of a few nanometres, for example from 2 to 5 nm.

REFERENCES

[1] Even et al, "Enhanced In incorporation in full InGaN heterostructure grown on relaxed InGaN pseudo-substrate", Appl. Phys. Lett. 110, 262103 (2017).

[2] Jang et al, "Electrical and structural properties of GaN films and GaN/InGaN light-emitting diodes grown on porous GaN templates fabricated by combined electrochemical and photoelectrochemical etching", Journal of Alloys and Compounds 589 (2014) 507-512.

The invention claimed is:

1. A process for manufacturing a relaxed epitaxially grown InGaN layer from a GaN/InGaN substrate comprising the following steps of:

a) providing a first stack successively comprising an initial substrate, a GaN layer, a doped InGaN layer comprising a first face and a second face, and an unintentionally doped InGaN layer, wherein the first face of the doped InGaN layer faces the GaN layer and the second face of the doped InGaN layer contacts the unintentionally doped InGaN layer, b) transferring the doped InGaN layer and the unintentionally doped InGaN layer to an anodising support, the unintentionally doped InGaN layer being in contact with the anodising support so as to form a second stack, and the first face of the doped InGaN layer is accessible to an electrolyte solution, c) connecting the doped InGaN layer and a counter-electrode to a voltage or current generator, d) dipping the second stack and the counter-electrode into the electrolyte solution, such that the first face of the doped InGaN layer contacts the electrolyte solution e) porosifying the doped InGaN layer by applying a voltage or current, between the doped InGaN layer and the counter-electrode to form a doped InGaN layer porosified comprising a first face and a second face, f) transferring the doped InGaN layer porosified and the unintentionally doped InGaN layer to a support of interest to form the GaN/InGaN substrate, wherein a front face of the GaN/InGaN substrate comprises the second face of the doped InGaN layer porosified, g) forming an InGaN layer by epitaxy on the unintentionally doped InGaN layer, whereby a relaxed epitaxially grown InGaN layer is obtained.

2. The process according to claim 1, wherein the support of interest comprises a support layer and a buried oxide layer.

3. The process according to claim 2, wherein the support layer is made of sapphire or silicon.

4. The process according to claim 1, wherein the GAN layer is an unintentionally doped GAN layer, and wherein the first stack further comprises a highly doped GaN layer, disposed between the unintentionally doped GaN layer and the doped InGaN layer.

5. The process according to claim 4, wherein step b) is carried out according to the following steps of:

electrochemically anodising the highly doped GaN layer to embrittle it, separating the doped InGaN layer and the unintentionally doped InGaN layer from the highly doped GaN layer by thermal activation and/or mechanical action.

6. The process according to claim 4, wherein step b) includes a step in which electrochemical anodization is carried out on the highly doped GaN layer until it dissolves, whereby the doped InGaN layer and the unintentionally doped InGaN layer are separated from the doped GaN layer.

7. The process according to claim 1, wherein step b) is carried out according to a process comprising the following steps of:

implanting atomic species to form an embrittlement zone in the doped InGaN layer at a depth close to the final thickness of the layer to be maintained in the final substrate, bonding the first stack to the anodising support, the undoped InGaN layer being in contact with the anodising support, delivering thermal energy to unsecure the doped InGaN layer from the GaN layer in the embrittlement zone.

8. The process according to claim 1, wherein the process includes a subsequent step in which the doped InGaN layer and the unintentionally doped InGaN layer are structured to form InGaN mesas.

9. The process according to claim 8, wherein the doped InGaN layer and the unintentionally doped InGaN layer are structured by photolithography.

10. The process according to claim 8, wherein the process comprises a step in which a doping step by implantation or by metal-organic vapour phase epitaxy is carried out on the InGaN mesas.

11. The process according to claim 10, wherein different doping types are performed during the doping step.

12. The process according to claim 1, wherein the process includes, between step b) and step c), a step during which the doped InGaN layer and the unintentionally doped InGaN layer are structured in order to form InGaN mesas.

13. The process according to claim 12, wherein the doped InGaN layer and the unintentionally doped InGaN layer are structured by photolithography.

14. The process according to claim 12, wherein the process comprises a step, before step c), during which a doping step by implantation or by metal-organic vapour phase epitaxy is carried out on the InGaN mesas.

15. The process according to the claim 14, wherein different doping types are performed during the doping step.

* * * * *